(12) United States Patent
Hara (10) Patent No.: US 7,592,208 B2
(45) Date of Patent: Sep. 22, 2009

(54) METHOD FOR MANUFACTURING SEMICONDUCTOR SUBSTRATE AND METHOD FOR MANUFACTURING SEMICONDUCTOR APPARATUS AND PHOTOMASK

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 511 days.

(21) Appl. No.: 11/465,366

(22) Filed: Aug. 17, 2006

(65) Prior Publication Data

US 2007/0045739 A1    Mar. 1, 2007

(30) Foreign Application Priority Data

Aug. 26, 2005   (JP)   .............................. 2005-245356

(51) Int. Cl.
*H01L 21/84* (2006.01)
*H01L 27/12* (2006.01)
(52) U.S. Cl. ................. 438/149; 438/479; 257/E21.415
(58) Field of Classification Search ................. 438/149, 438/479
See application file for complete search history.

(56) References Cited

U.S. PATENT DOCUMENTS

| | | | | |
|---|---|---|---|---|
| 2002/0109521 | A1* | 8/2002 | Almonte et al. | 324/765 |
| 2003/0104681 | A1* | 6/2003 | Davari et al. | 438/480 |
| 2006/0022270 | A1* | 2/2006 | Boyd et al. | 257/351 |

OTHER PUBLICATIONS

T. Sakai et al. "Separation by Bonding Si Islands (SBSI) for LSI Applications," Second International SiGe Technology and Device Meeting Abstract, pp. 230-231, May 2004.

* cited by examiner

*Primary Examiner*—Alexander G Ghyka
(74) *Attorney, Agent, or Firm*—Oliff & Berridge, PLC (57) ABSTRACT

A method for manufacturing a semiconductor substrate, includes: forming a first semiconductor layer on a semiconductor base material; forming a second semiconductor layer on the first semiconductor layer, the second semiconductor layer having an etching selectivity larger than that of the first semiconductor layer; forming, at the second semiconductor layer and the first semiconductor layer in the vicinity of an element region, at least three or more hole portions for exposing the semiconductor base material; forming, on the semiconductor base material, a supporting body for supporting the second semiconductor layer on the semiconductor base material so that the hole portions are filled and the second semiconductor layer is covered; etching the supporting body at regions other than predetermined regions including the hole portions and the element region to form an aperture plane in the supporting body, the aperture plane exposes a part of an end section of the first semiconductor layer; etching the first semiconductor layer via the aperture plane to form a hollow section between the second semiconductor layer of the element region and the semiconductor base material; and forming an insulation film in the hollow section. The hole portions are formed so that at least two or more the hole portions are formed in one direction of the element region and at least one or more the hole(s) is/are formed in the other direction crossing the one direction of the element region.

9 Claims, 14 Drawing Sheets

METHOD FOR MANUFACTURING SEMICONDUCTOR SUBSTRATE AND METHOD FOR MANUFACTURING SEMICONDUCTOR APPARATUS AND PHOTOMASK

BACKGROUND OF THE INVENTION

1. Technical Field

The present invention relates to a method for manufacturing a semiconductor substrate and a method for manufacturing a semiconductor apparatus and a photomask. In particular, the invention relates to a technique for forming a SOI (Silicon on Insulator) structure on a semiconductor substrate.

2. Related Art

A field effect type transistor formed on a Silicon On Insulator (SOI) substrate has attracted attention for the usefulness because elements can be separated easily, it is latchup free, and it has a small source/drain junction capacity for embodiment. A complete depletion type SOI transistor in particular, which consumes a low power and can be operated with a high speed and can be easily driven with a low voltage, has been actively researched in order to operate the SOI transistor with a complete depletion mode.

SOI substrates are produced using a technique such as a Separation by Implanted Oxygen (SIMOX) substrate and a laminated substrate. However, these techniques use special manufacture processes and thus cannot use a general CMOS process Due to this reason, Separation by Bonding Silicon Islands (SBSI), which is a method for manufacturing a SOI structure out of a common bulk silicon wafer by a general CMOS process, has been known (see the following embodiment for embodiment). Hereinafter, a method for manufacturing a semiconductor apparatus according to this SBSI method (conventional embodiment) will be described.

FIG. 10A to FIG. 16C illustrate a method for manufacturing a semiconductor substrate according to a conventional embodiment. In particular, FIG. 10A, FIG. 11A, FIG. 12A, FIG. 13A, FIG. 14A, FIG. 15A, and FIG. 16A are a top view illustrating a method for manufacturing a semiconductor substrate according to a conventional embodiment, respectively. FIG. 10B, FIG. 11B, FIG. 12B, FIG. 13B, FIG. 14B, FIG. 15B, and FIG. 16B are a cross-sectional view illustrating FIG. 10A, FIG. 11A, FIG. 12A, FIG. 13A, FIG. 14A, FIG. 15A, and FIG. 16A cut at a line a-a'. FIG. 12C, FIG. 13C, FIG. 14C, FIG. 15C, and FIG. 16C are a cross-sectional view illustrating FIG. 12A, FIG. 13A, FIG. 14A, FIG. 15A, and FIG. 16A cut at a line b-b'.

Figure 10A:
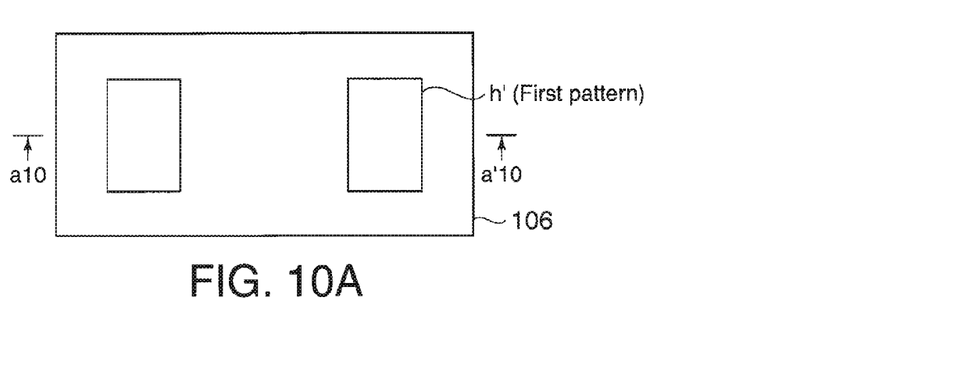
FIGS. 10A and 10B illustrate a method for manufacturing a semiconductor substrate according to a conventional embodiment.
Figure 10B:
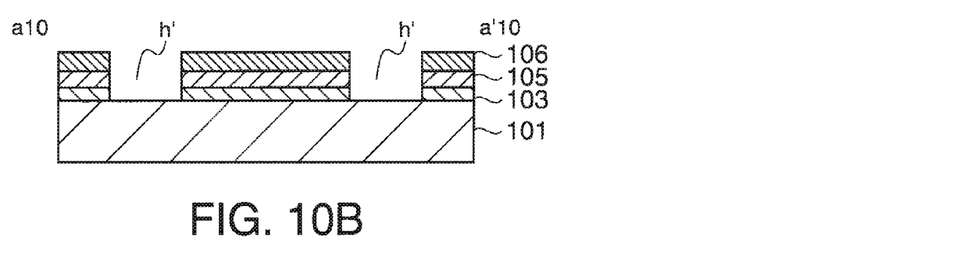

As shown in FIGS. 10A and 10B, a semiconductor substrate in a conventional embodiment is manufactured by firstly forming a SiGe layer 103 on a Si substrate 101 as a bulk silicon wafer to form a Si layer (SOI layer) 105 on the SiGe layer 103. The SiGe layer 103 and the Si layer 105 are formed by an epitaxial growth, respectively. Next, trenches h' for a supporting body are formed in the Si layer 105 and the SiGe layer 103 in the vicinity of element regions. Specifically, trench formation regions are opened as shown in FIGS. 10A and 10B and resist patterns 106 for covering regions other than them are formed.

Next, the Si layer 105 and the SiGe layer 103 are sequentially etched by using this resist pattern 106 as a mask to expose a surface of the Si substrate 101 under the resist pattern 106. As a result, the trench h' is formed. Hereinafter, a region in which this trench h' is formed will be called as "the first pattern".

Figure 11A:
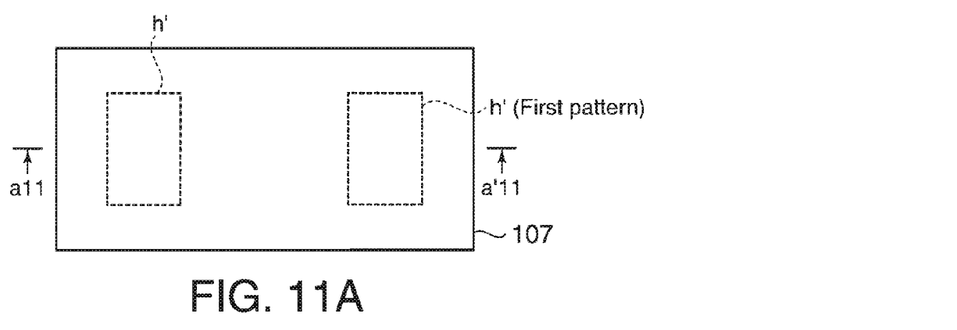
FIGS. 11A and 11B illustrate a method for manufacturing a semiconductor substrate according to a conventional embodiment.
Figure 11B:
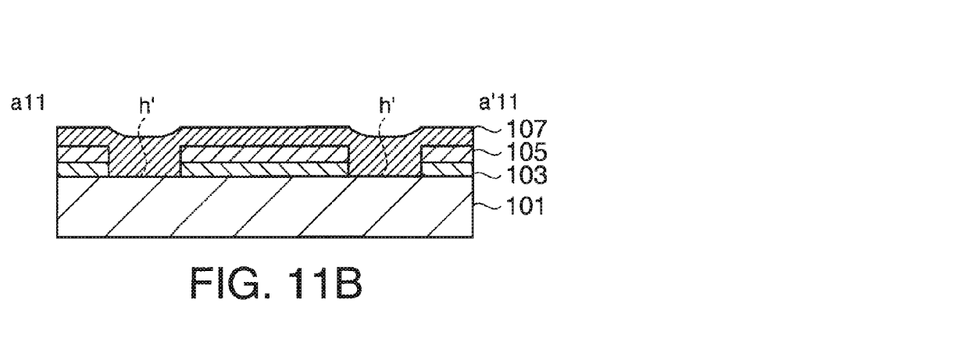
Figure 12A:
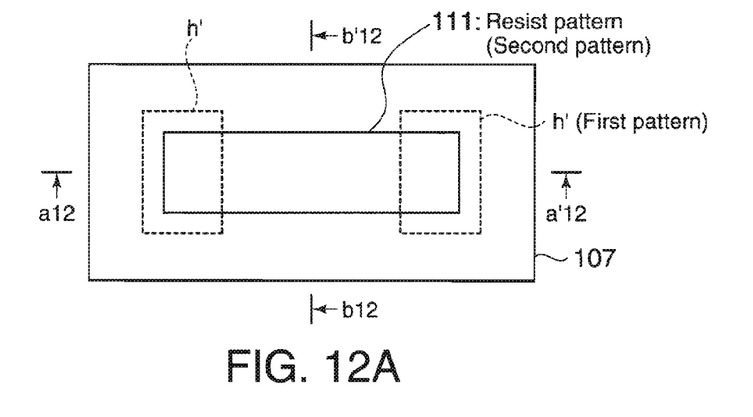
FIGS. 12A, 12B, and 12C illustrate a method for manufacturing a semiconductor substrate according to a conventional embodiment.
Figure 12B:
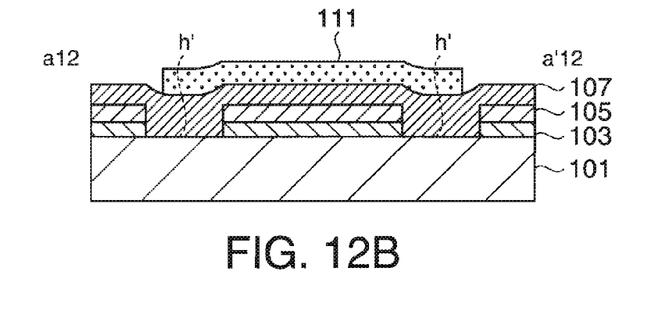
Figure 12C:
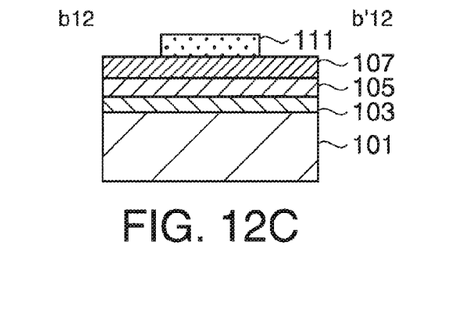

Next, the resist patterns 106 are removed. Then, as shown in FIGS. 11A and 11B, a method such as CVD is used to form a supporting body (e.g., $SiO_2$ film) 107 over the entire upper part of the Si substrate 101. Next, as shown in FIGS. 12A to 12C, the supporting body 107 has thereon a resist pattern 111 that covers a wide region from a region in which the SOI structure is formed to the trenches h'.

Figure 13A:
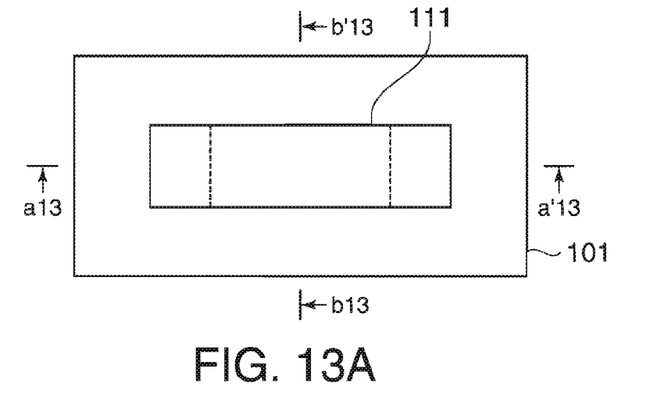
FIGS. 13A, 13B, and 13C illustrate a method for manufacturing a semiconductor substrate according to a conventional embodiment.
Figure 13B:
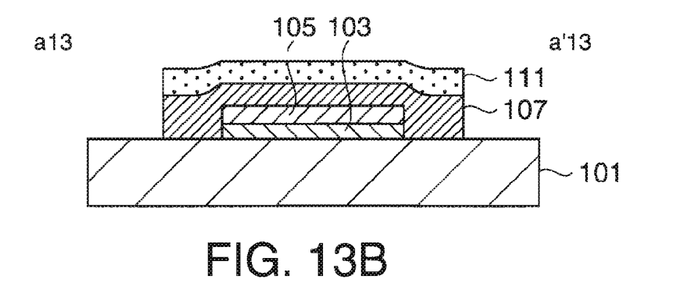
Figure 13C:
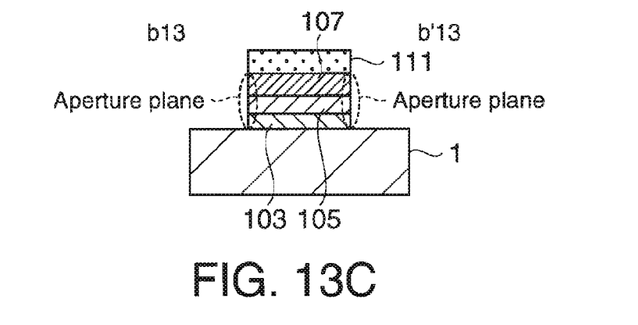

Then, as shown in FIGS. 13A to 13C, the supporting body 107, the Si layer 105, and the SiGe layer 103 are sequentially etched by using this resist pattern 111 as a mask. These etchings are performed by using an anisotropic dry etching apparatus. As a result, an aperture plane that exposes a part of a side face of the SiGe layer 103 and a part of a side face of the Si layer 105 (end section) is formed in the supporting body 107. This etching leaves the Si layer 105 and the SiGe layer 103 only on the Si substrate 101 of the element region and removes the Si layer 105 and the SiGe layer 103 from the Si substrate 101 on regions other than the element region. Hereinafter, a region covered by the patterned supporting body 101 will be called as "the second pattern".

Figure 14A:
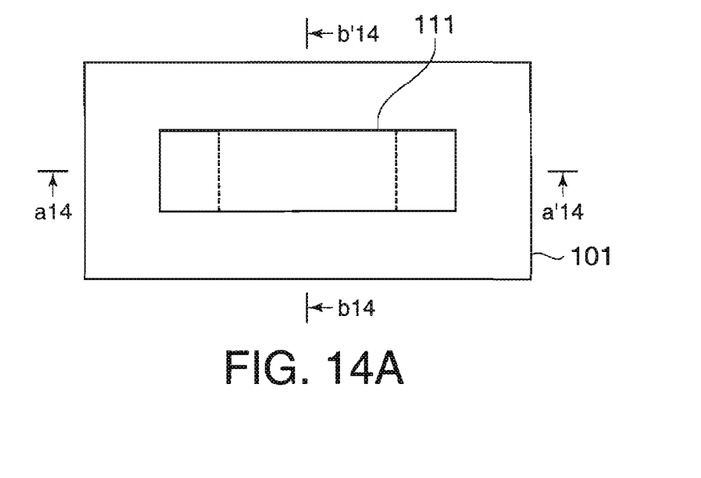
FIGS. 14A, 14B, and 14C illustrate a method for manufacturing a semiconductor substrate according to a conventional embodiment.
Figure 14B:
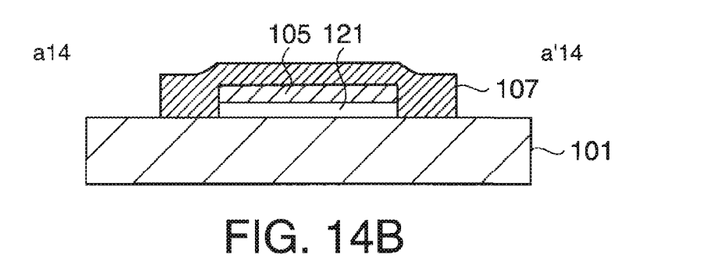
Figure 14C:
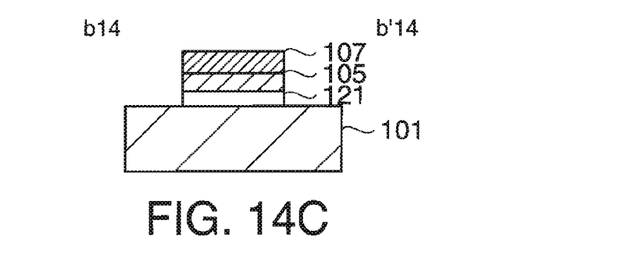
Figure 15A:
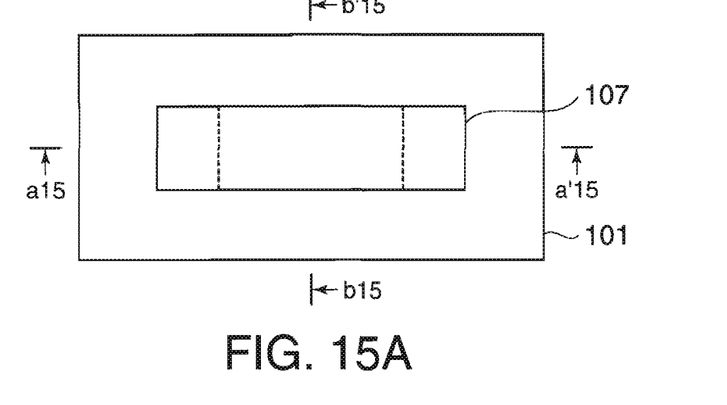
FIGS. 15A, 15B, and 15C illustrate a method for manufacturing a semiconductor substrate according to a conventional embodiment.
Figure 15B:
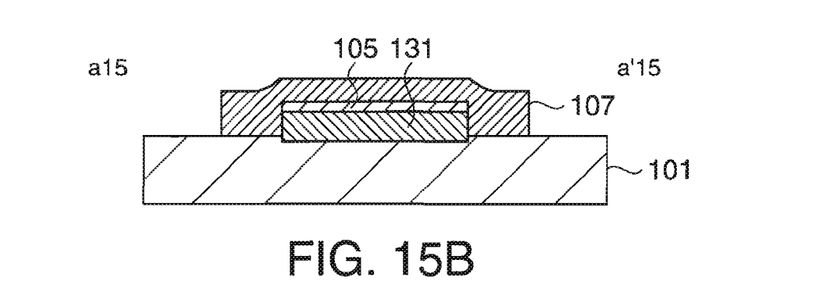
Figure 15C:
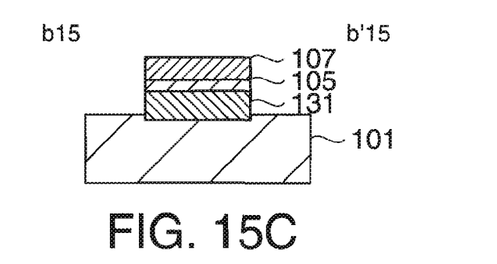

Next, the SiGe layer 103 and the Si layer 105 have a contact with etching solution such as mixture of fluoric acid and nitric acid via the aperture plane formed in supporting body 107 to etch and remove only the SiGe layer 103. As a result, a hollow section 121 is formed as shown in FIGS. 14A to 14C between the Si substrate 101 and the Si layer 105. Next, the Si substrate 101 is subjected to thermal oxidation in which oxidizing species such as $O_2$ reaches not only the surface of the substrate 101 exposed under the supporting body 107 but also the hollow section 121 via the aperture plane. This forms, as shown in FIGS. 15A to 15C, a $SiO_2$ film (BOX layer) 131 in the hollow section.

Figures 16A, 16B:
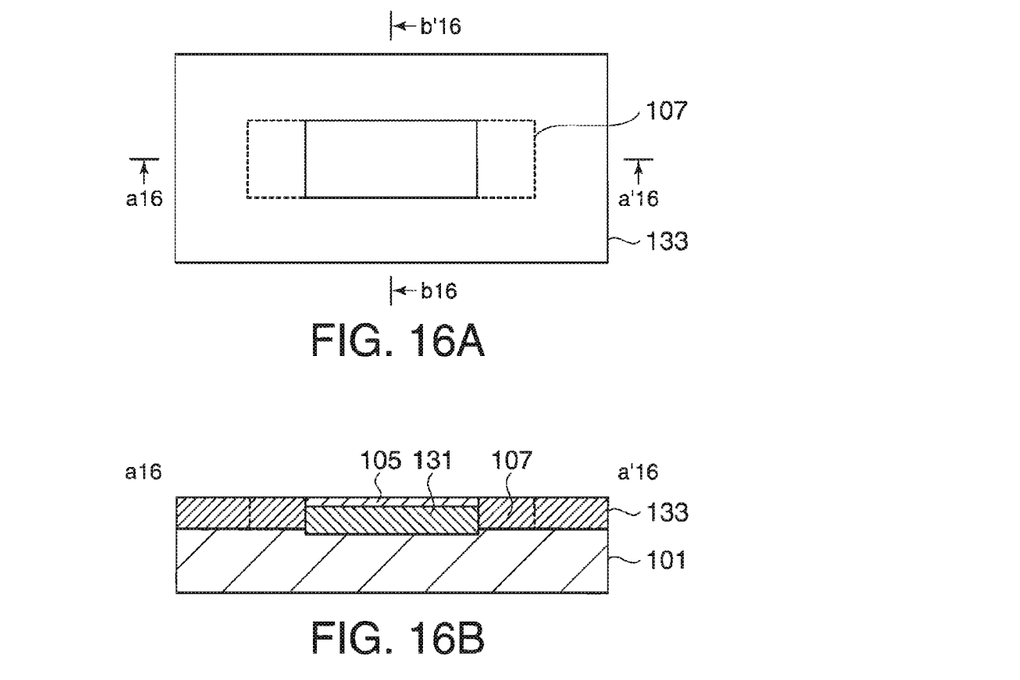
FIGS. 16A, 16B, and 16C illustrate a method for manufacturing a semiconductor substrate according to a conventional embodiment.
Figure 16C:
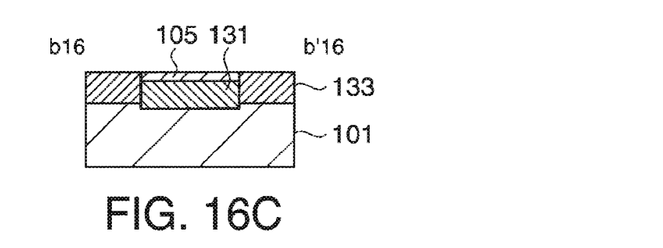

Next, as shown in FIGS. 16A to 16C, a method such as CVD is used to firm a $SiO_2$ film 133 for an element isolation over the entire upper face of the Si substrate 101. Then, CMP is used to planarize the entire upper face of the Si substrate 101 to remove the $SiO_2$ film 133 and the supporting body 107 from the upper part of the Si layer 105. As a result, a structure is completed in the Si substrate 101 in which the upper face of the Si layer 105 is exposed and the Si layer 105 is element-divided by an insulation film (i.e., SOI structure).

An embodiment of related art is "Separation by Bonding Si Islands (SBSI) for LSI Applications" (T, Sakai et al., Second International SiGe Technology and Device Meeting Abstract, pp. 230-231, May (2004)).

By the way, the method for manufacturing a semiconductor substrate according to the above conventional embodiment provides a structure as shown in FIG. 12(A) in which the first patterns are formed at opposing sides (e.g., left and right sides) of the second pattern having a rectangular shape when seen from the top and in which the first pattern is not formed at the other pair of sides (e.g., upper and lower sides).

Figure 17:
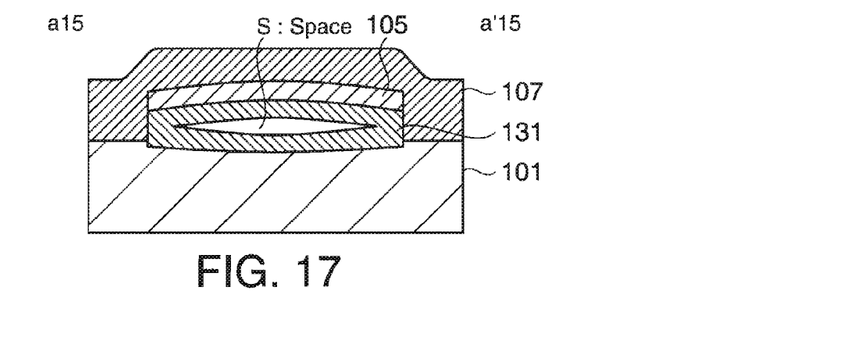
FIG. 17 illustrates a problem of a conventional embodiment.

When the SOI structure is formed with the positional relation of the first and second patterns as described above, the Si layer 105 and the $SiO_2$ film 131 are pressed by the supporting body only at one pair of sides (e.g., left and right sides) for embodiment and are not pressed by the other pair of sides (e.g., upper and lower sides). Due to this, some oxidation conditions or heating conditions may cause an excessive stress to the supporting body. This may cause a risk where the Si layer 105 and the $SiO_2$ film 131 are bent as shown in FIG. 17 to have a curved cross section to cause a space S at the center of an active region.

As described above, the space S at the center of the active region may suppress heat generated at a transistor from escaping to the Si substrate 101, thus deteriorating the transistor characteristic.

SUMMARY

An advantage of the invention is to provide a method for manufacturing a semiconductor substrate and a method for manufacturing a semiconductor apparatus, and a photomask by which a SOI structure can be formed while preventing a space from being generated at the center of an element region.

[First Aspect to Third Aspect]

In order to achieve the above objective, a method for manufacturing a semiconductor substrate of the first aspect includes: forming a first semiconductor layer on a semiconductor base material; forming a second semiconductor layer on the first semiconductor layer, the second semiconductor layer having an etching selectivity larger than that of the first semiconductor layer; forming, at the second semiconductor layer and the first semiconductor layer in the vicinity of an element region, at least three or more hole portions for exposing the semiconductor base material; forming, on the semiconductor base material, a supporting body for supporting the second semiconductor layer on the semiconductor base material so that the hole portions are filled and the second semiconductor layer is covered; etching the supporting body at regions other than predetermined regions including the hole portions and the element region to form an aperture plane in the supporting body, the aperture plane exposes a part of an end section of the first semiconductor layer; etching the first semiconductor layer via the aperture plane to form a hollow section between the second semiconductor layer of the element region and the semiconductor base material; and forming an insulation film in the hollow section. The hole portions is formed so that at least two or more the hole portions are formed in one direction of the element region and at least one or more the hole(s) are formed in the other direction crossing the one direction of the element region.

The term "semiconductor base material" means, for embodiment, a bulk silicon (Si) substrate. The term "the first semiconductor layer" means, for embodiment, a silicon germanium (SiGe) layer obtained by an epitaxial growth. The term "the second semiconductor layer" means, for embodiment, a Si layer obtained by an epitaxial growth. SiGe is etched by fluoro-nitric acid for embodiment.

A method for manufacturing a semiconductor substrate of the second aspect is that, in the method for manufacturing a semiconductor substrate of the first aspect, the hole portions is formed so that at least two or more the hole portions are formed in one direction of the element region and at least two or more the hole portions are formed in the other direction orthogonal to the one direction of the element region.

A method for manufacturing a semiconductor substrate of the third aspect is that, in the method for manufacturing a semiconductor substrate of the first aspect or the second aspect, the element region has a concave section at a part of the outer periphery thereof; and the forming the hole portions forms the hole portions at positions adjacent to the concave sections of the predetermined region when seen from the top.

The method for manufacturing a semiconductor substrate of the first aspect to the third aspect can provide, when compared with the conventional technique, more uniform stress applied to the supporting body while securing the aperture plane for etching the first semiconductor layer. Thus, a space can be prevented from being generated at the center of the element region.

[Fourth Aspect]

A method for manufacturing a semiconductor substrate of the fourth aspect is that, in the method for manufacturing a semiconductor substrate of the first aspect or the second aspect, the predetermined region has, at a part of the outer periphery thereof, a convex section protruding from the element region; and the forming the hole portions forms the hole portions at the convex section of the predetermined region.

The structure as described above can eliminate a concave section at the outer periphery of the element region. Thus, an increased element region can be secured when compared with a case of the third aspect and the width of a gate of a transistor can be increased.

[Fifth Aspect]

A method for manufacturing a semiconductor substrate of the fifth aspect is that, in the method for manufacturing a semiconductor substrate of any one of the first aspect to the fourth aspect, the forming the hole portions forms two or more the hole portions at one side of an outer periphery of the element region.

The structure as described above can provide an increased area at which the supporting body has a contact with the semiconductor base material (i.e., leg) and thus stress applied to the supporting body can be dispersed. This structure is particularly preferable for a case where the element region has a large area.

[Sixth Aspect]

A method for manufacturing a semiconductor substrate of the sixth aspect is that, in the method for manufacturing a semiconductor substrate of any one of the first aspect to the fifth aspect, the forming an insulation film in the hollow section is followed by planarizing an entire upper face of the semiconductor base material to remove the supporting body on the second semiconductor layer.

The structure as described above exposes the surface of the second semiconductor layer under the supporting body. Thus, an element such as a transistor can be formed in the second semiconductor layer.

[Seventh Aspect]

A method for manufacturing a semiconductor apparatus of the seventh aspect is that, the method for manufacturing a semiconductor substrate of the sixth aspect is performed to remove the supporting body on the second semiconductor layer to subsequently form a transistor on the second semiconductor layer.

The structure as described above uses the method for manufacturing a semiconductor substrate of the seventh aspect and thus can provide a method for manufacturing a semiconductor apparatus by which a space can be prevented from being generated at the center of the element region.

[Eighth Aspect]

A photomask of the invention is a photomask used in the method for manufacturing a semiconductor substrate according to any one of the first aspect to the sixth aspect. Further, the photomask has a light blocking pattern so that light is selectively transmitted through a photoresist on the semiconductor base material to form at least two or more to-be-developed regions in one direction of the element region and to form at least one to-be-developed region(s) in the other direction crossing the one direction of the element region. The term "to-be-developed region" means a region in which photoresist is removed by a development step after an exposure step to form an opening section.

The structure as described above can form at least two or more hole portions in one direction of the element region and can form at least one hole(s) in the other direction of the element region.

The invention is very preferable for the so-called SBSI technique in which a SOI structure is formed only at a desired region of a bulk semiconductor substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

Embodiment 1

Figure 1A:
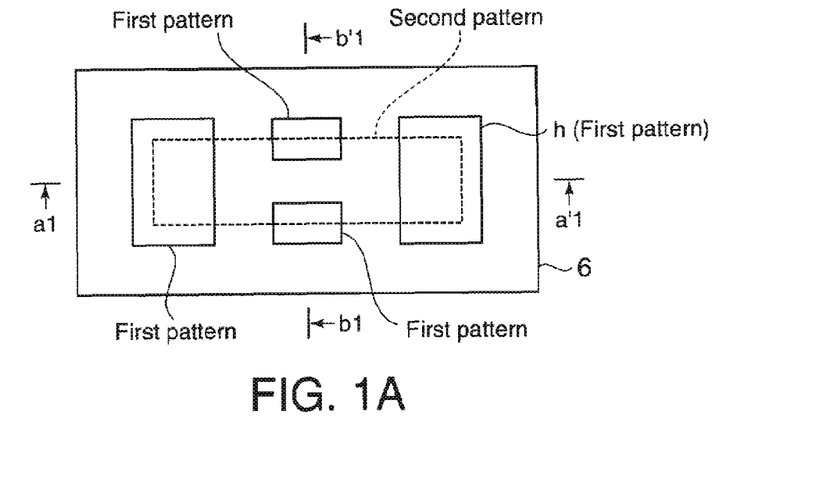
FIGS. 1A to 1C illustrate a method for manufacturing a semiconductor apparatus according to Embodiment 1.

FIG. 1A to FIG. 4 illustrate a method for manufacturing a semiconductor apparatus according to Embodiment 1 of the invention. In particular, FIG. 1A, FIG. 2A, and FIG. 3A are a top view illustrating a method for manufacturing a semiconductor apparatus according to Embodiment 1. FIG. 1B, FIG. 2B, and FIG. 3B are a cross-sectional view illustrating FIG. 1A, FIG. 2A, and FIG. 3A cut at lines a1-a1', a2-a2', and a3-a3', respectively. FIG. 1C, FIG. 2C, and FIG. 3C are a cross-sectional view illustrating FIG. 1A, FIG. 2A, and FIG. 3A cut at lines b1-b1', b2-b2', and b3-b3', respectively. FIG. 2D and FIG. 3D are a cross-sectional view illustrating FIG. 2A and FIG. 3A cut at lines c1-c1' to c2-c2', respectively.

According to this invention, a SOI structure is formed by a new positional relation between the first pattern and the second pattern so that a supporting body can receive uniform stress during an oxidation processing and a heating processing.

Figure 1B:
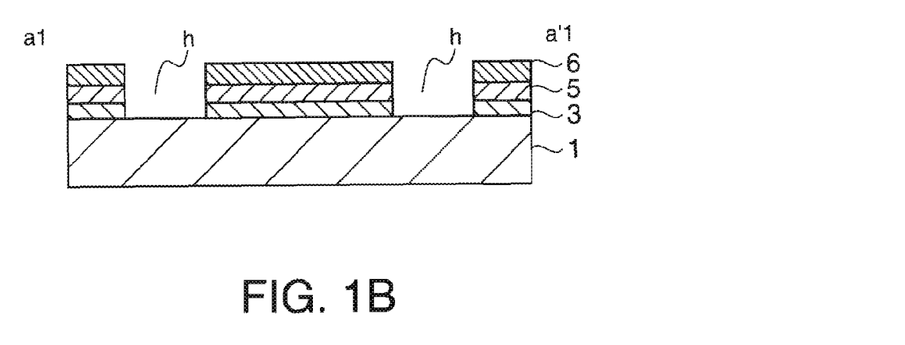
Figure 1C:
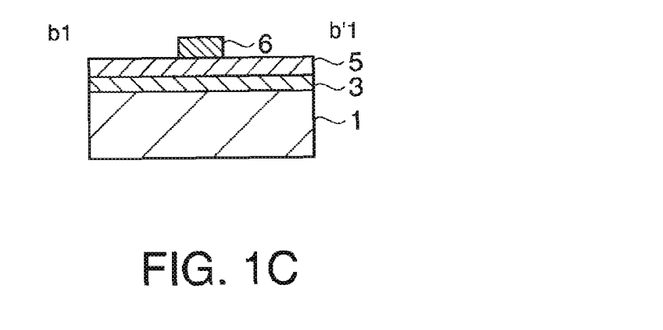
Figure 2A:
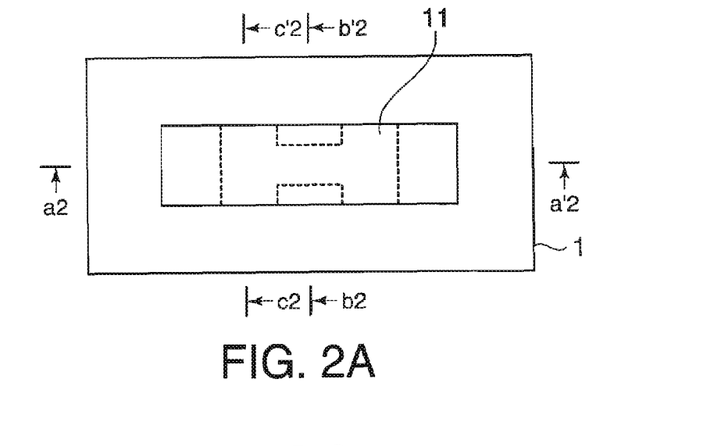
FIGS. 2A to 2D illustrate a method for manufacturing a semiconductor apparatus according to Embodiment 1.
Figure 2B:
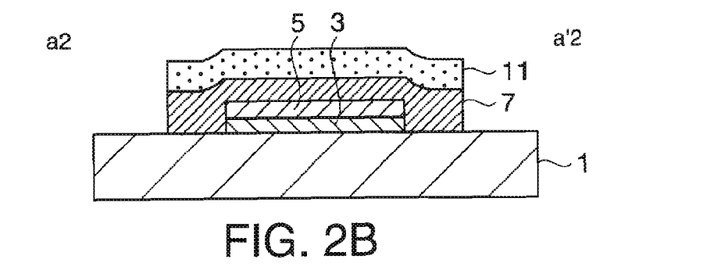
Figure 2C:
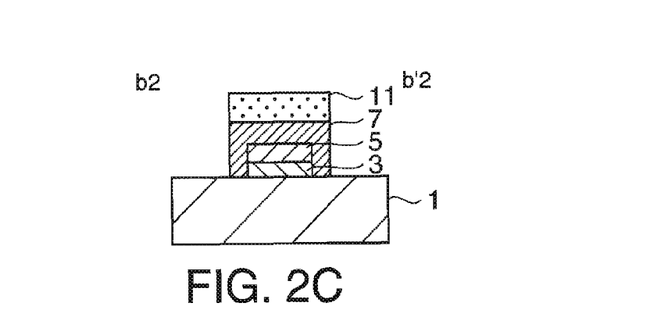
Figure 2D:
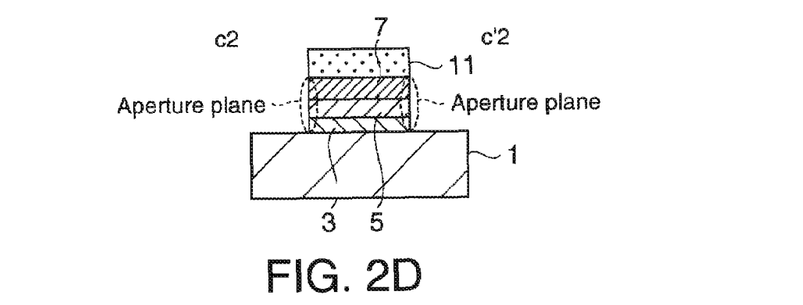
Figure 3A:
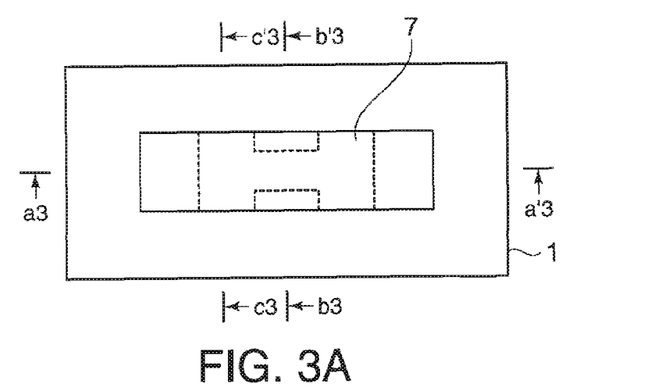
FIGS. 3A to 3D illustrate a method for manufacturing a semiconductor apparatus according to Embodiment 1.
Figure 3B:
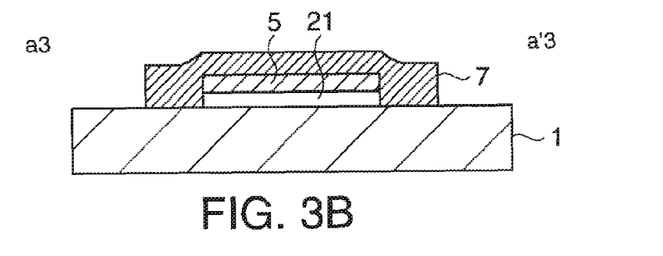
Figure 3C:
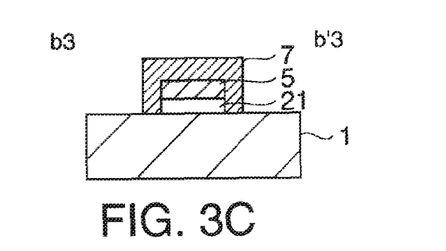
Figure 3D:
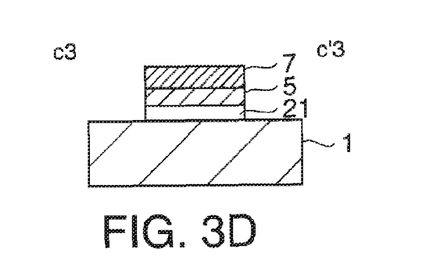

First, as shown in FIGS. 1A to 1C, a SiGe layer 3 is formed on a Si substrate 1 as a bulk silicon wafer. Then, a Si layer (SOI layer) 5 is formed on the SiGe layer 3. The SiGe layer 3 and the Si layer 5 are formed by an epitaxial growth, respectively.

Next, a trench formation region is opened and a resist pattern 6 covering regions other than the trench formation region is formed. Then, the Si layer 5 and the SiGe layer 3 are sequentially etched by using the resist pattern 6 as a mask, thereby exposing the surface of the Si substrate 1 under the resist pattern 6. As a result, a trench h is formed at the Si layer 5 and the SiGe layer 3 in the vicinity of the element region.

In this embodiment, a region in which the trench h is formed is called as "the first pattern" and a region covered by a patterned supporting body 7 (see FIGS. 2A to 2D) is called as "the second pattern" as in a conventional embodiment. It is noted that the supporting body 7 is not yet formed in steps shown in FIGS. 1A to 1C and thus the second pattern is shown by a phantom line.

As shown in FIGS. 1A to 1C, the second pattern in Embodiment 1 formed to have a rectangular shape when seen form the top is structured such that the first patterns are provided at one pair of sides opposing to each other (left and right sides) and the first patterns are formed also at the other pair of sides (upper and lower sides). These four first patterns are respectively superposed with the outer periphery of the second pattern such that, in order to secure a path through which fluoro-nitric acid is introduced during the formation of the hollow section 21 under the supporting body 7, a sufficient space is provided between a first pattern and another first pattern neighboring to each other along the outer periphery of the second pattern.

Figure 5A:
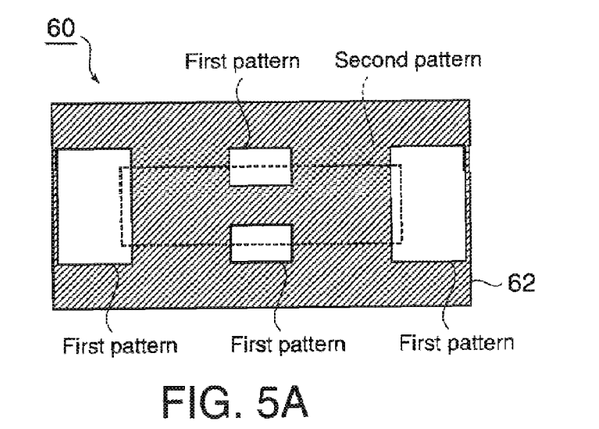
FIGS. 5A and 5B are top views illustrating an embodiment of a structure of the photomask 60 according to Embodiment 1 and an embodiment of a structure of the SOI transistor 50.

The resist pattern 6 shown in FIGS. 1A to 1C is formed by, for embodiment, using a spin coater to coat photoresist (e.g., positive resist) on the Si substrate 1 to subsequently subject this photoresist to an exposure processing by a photomask 60 as shown in FIG. 5(A) to subsequently subject this Si substrate 1 to a development processing. As shown in FIG. 5A, this photomask 60 has a light blocking pattern 62 through which light passes only a part corresponding to the first pattern and light does not passes parts other than this part. Light having passed this light blocking pattern 62 is subjected to a reduced projection exposure on a photoresist. Then, in the case of positive resist, only a part to which light impinges (to-be-developed region) is removed by developing fluid. The light blocking pattern 62 as described above is made of, for embodiment, chromium (Cr) formed at a surface of a quartz-made plate. It is noted that FIG. 5A illustrates the second pattern by a phantom line in the photomask 60 in order to clarify the positional relation between the first pattern and the second pattern.

Next, back to FIGS. 1A to 1C, the resist pattern 6 is removed. Steps after this step are the same as those of the conventional embodiment.

Specifically, a method such as CVD is used to form the supporting body 7 (e.g., $SiO_2$ film) over the entire upper part of the Si substrate 1. Next, as shown in FIGS. 2A to 2D, the resist pattern 11 covering a wide region from a region in which a SOI structure is formed to the trench (i.e., the second pattern) is formed on the supporting body 7.

Next, as shown in FIGS. 2A to 2D, the supporting body 7, the Si layer 5, and the SiGe layer 3 are sequentially etched by using the resist pattern 11 as a mask. These etchings are performed by an anisotropic dry etching apparatus. As a result, an aperture plane that exposes a part of the SiGe layer 3 and a part of the side face (end section) of the Si layer 5 is formed in the supporting body 7. This etching leaves the Si layer 5 and the SiGe layer 3 only on the Si substrate 1 of the element region (active region) and removes the Si layer 5 and the SiGe layer 3 from the Si substrate 1 at regions other than the element region.

Next, the SiGe layer 3 and the Si layer 5 have a contact with etching solution (e.g., fluoro-nitric acid) via the aperture plane formed in the supporting body 7 to etch and remove only the SiGe layer 3. This forms, as shown in FIGS. 3A to 3D, the hollow section 21 between the Si substrate 1 and the Si layer 5. Next, the Si substrate 1 is subjected to thermal oxidation in which oxidizing species such as $O_2$ reaches not only the surface of the Si substrate 1 exposed under the supporting body 7 but also the hollow section 21 via the aperture plane. Thus, an insulation film such as $SiO_2$ (BOX layer) is formed in the hollow section. When this thermal oxidation does not fill the hollow section completely, then the thermal oxidation may be followed by an annealing by a heating furnace to reflow the supporting body 7 to completely fill the hollow section 21.

Next, a method such as CVD is used to form a $SiO_2$ film for element division over the entire upper part of the Si substrate 1. Then, CMP is used to planarize the entire upper surface of the Si substrate 1 to remove the $SiO_2$ film and the supporting body 7 from the upper part of the Si layer 5. As a result, the upper face of the Si layer 5 is exposed and a structure in which the Si layer 5 is element-divided by an insulation film (i.e., SOI structure) is completed at the Si substrate 1.

Figure 4:
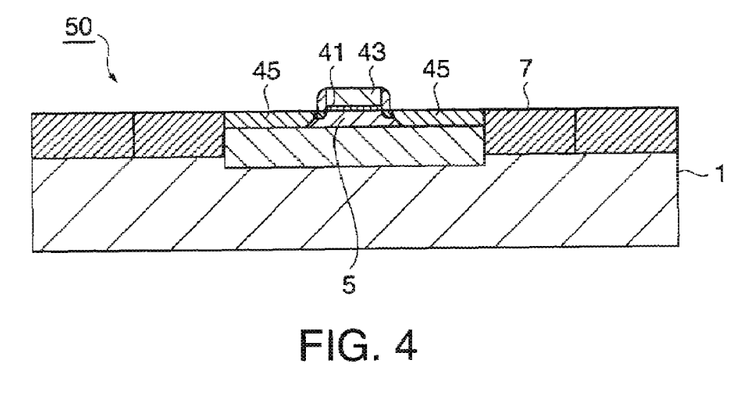
FIG. 4 is a cross-sectional view illustrating an embodiment of a structure of the SOI transistor 50 according to Embodiment 1.

Next, the surface of the Si layer 5 is subjected to thermal oxidation as shown in FIG. 4 to form a gate insulation film 41 at the surface of the Si layer 5. Then, a gate electrode 43 is formed on the Si layer 5 including the gate insulation film 41. Then, impurity (e.g., As, P, B) is ion-implanted into the Si layer 5 by using this gate electrode 43 or the like as a mask to form a source/drain 45, thereby completing the SOI transistor 50.

As described above, according to the method for manufacturing a semiconductor apparatus of Embodiment 1 of the invention, the first pattern is provided to the second pattern so that the first pattern is provided not in two directions of up-and-down or left-and-right directions but in four directions of left and right directions as well as up and down directions. This can disperse, when compared with a case of the conventional embodiment, the stress applied to the supporting body 7 in a greater number of directions while securing the aperture plane for etching the SiGe layer 3 to the supporting body 7, thus preventing a space from being generated at the center of the element region.

Embodiment 2

Figure 5B:
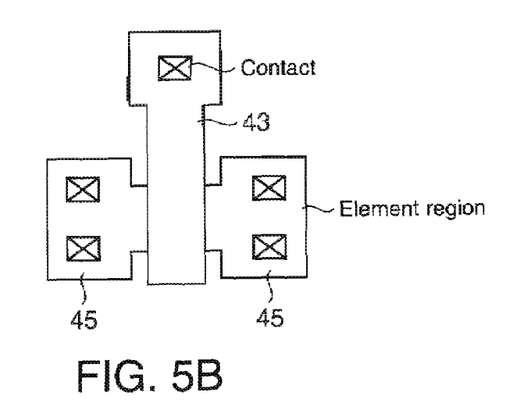
Figure 6A:
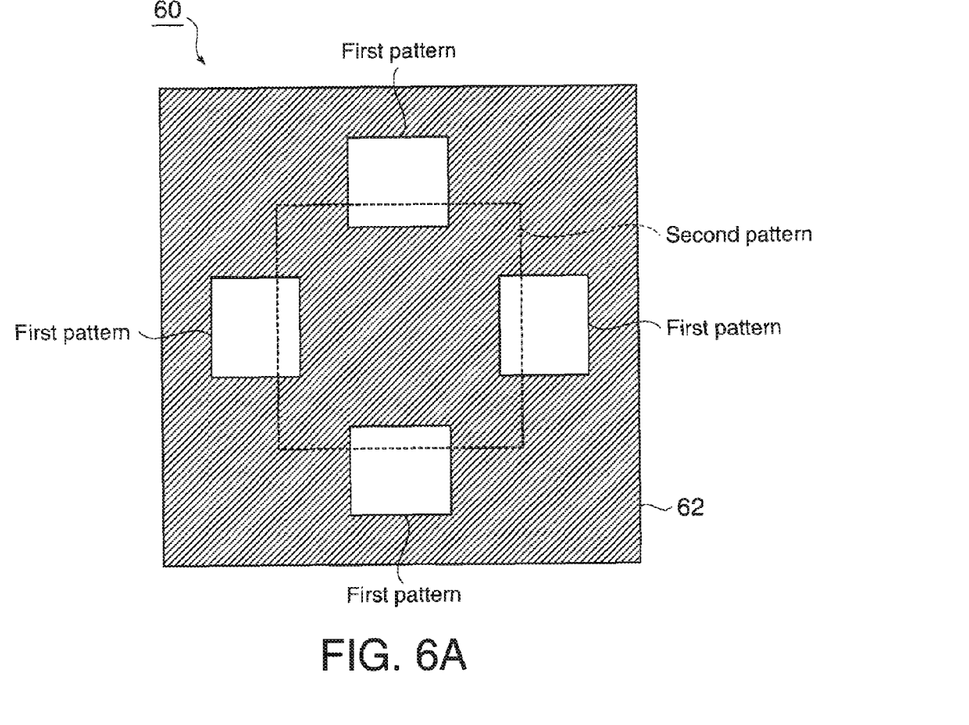
FIGS. 6A and 6B illustrate Embodiment 2.
Figure 6B:
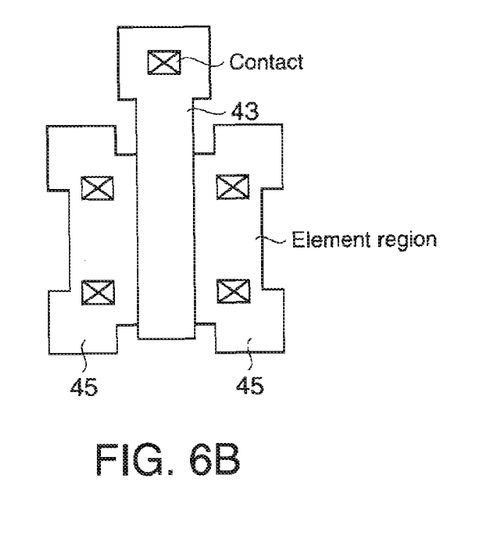

FIGS. 6A and 6B illustrate Embodiment 2. FIGS. 6A and 6B show components corresponding to those in FIGS. 5A and 5B with the same reference numerals and thus these components will not be described further. Embodiment 1 showed a case where the first patterns are arranged to have a longer length in the left-and-right direction of the second pattern and to have a shorter length in the up-and-down direction (see FIG. 5).

However, the first patterns also may be arranged as shown in FIG. 6(A) to have an identical length to the second pattern when seen from the top. This arrangement provides more uniform stress to the supporting body during an oxidation for filling the hollow section for embodiment. This arrangement also can secure, in contrast with Embodiment 1, left and right aperture planes for etching the SiGe layer and thus provides an easy introduction of fluoro-nitric acid under the supporting body.

Embodiment 3

Figure 7A:
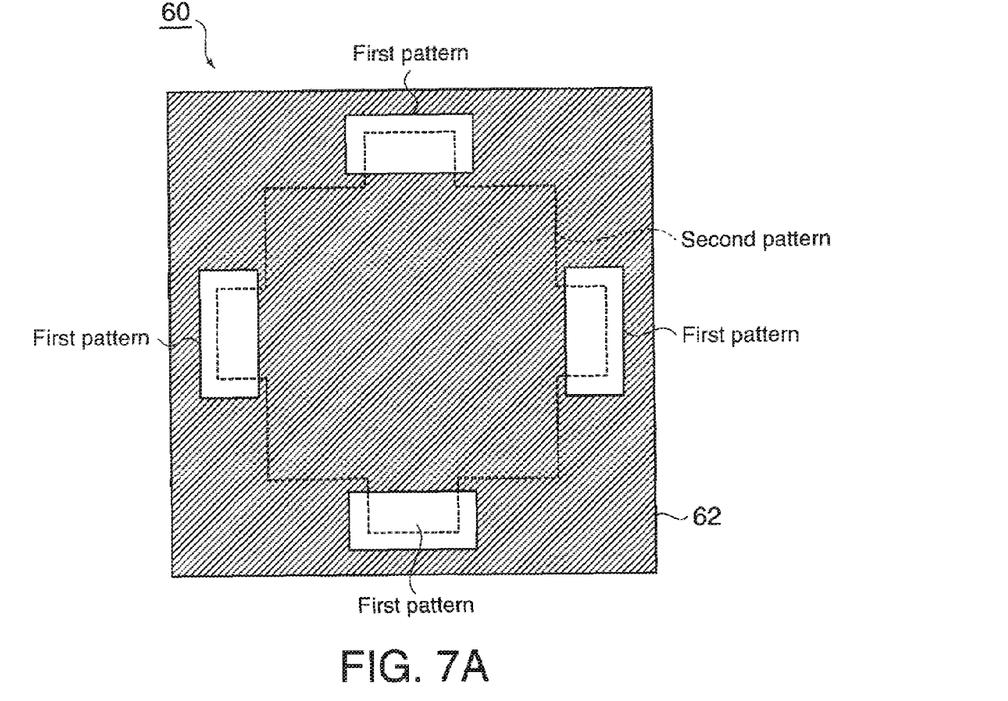
FIGS. 7A and 7B illustrate Embodiment 3.
Figure 7B:
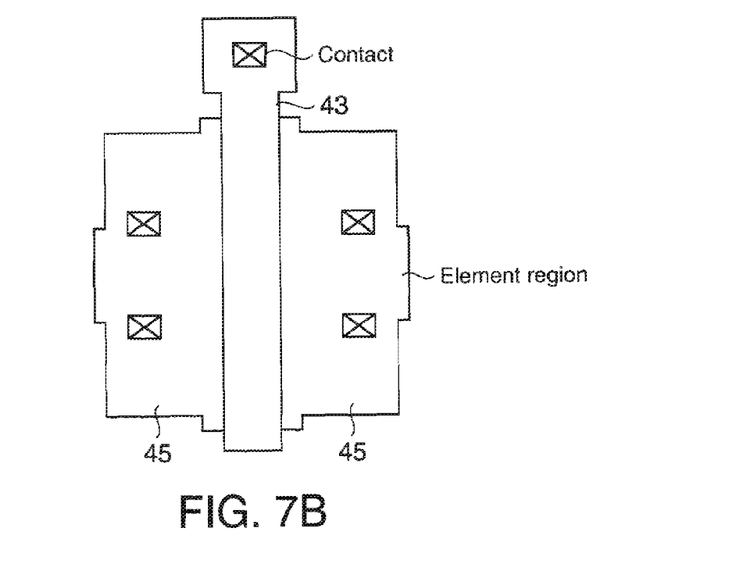

FIGS. 7A and 7B illustrate Embodiment 3. FIGS. 7A and 7B show components corresponding to those in FIGS. 5A and 5B with the same reference numerals and thus these components will not be described further.

As shown in FIGS. 5A and 5B, the element region of Embodiment 1 has concave sections at a part of upper and lower sides of the outer periphery. Embodiment 1 showed a case where a step for forming the trenches h is performed so that the trenches h are partially adjacent to the concave sections of the second patterns when seen from the top (i.e., the step is performed as if the first pattern is inserted to the inner side of the element region at upper and lower sides of the second pattern). As shown in FIG. 6B, Embodiment 2 showed a case where concave sections are provided at a part of the outer periphery of upper and lower sides and at a part of the outer periphery of left and right sides of the element region and a step for forming the trenches h is performed so that all trenches h are adjacent to the concave sections of the second pattern when seen from the top.

However, the second pattern in Embodiment 3 also may be structured so that a part of the outer periphery has convex sections protruding from the element region. A step for forming the trench h also may be performed so that a part or the entirety of the trench h is formed at this convex section (i.e., a part of the outer periphery of the second pattern protrudes to an outer side when seen from the top and this protruded section is superposed with the first pattern when seen from the top). The structure as described above can eliminate a concavity of the outer periphery of the element region. Thus, when compared with Embodiment 1 and Embodiment 2, this structure can secure a wider element region and thus can increase the width of a gate of the transistor.

Embodiment 4

Figure 8A:
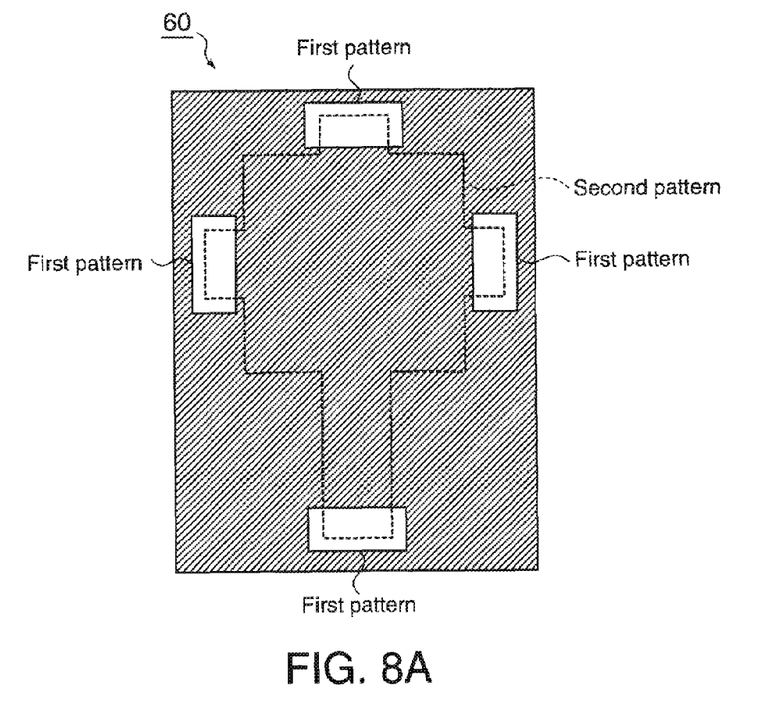
FIGS. 8A and 8B illustrate Embodiment 4.
Figure 8B:
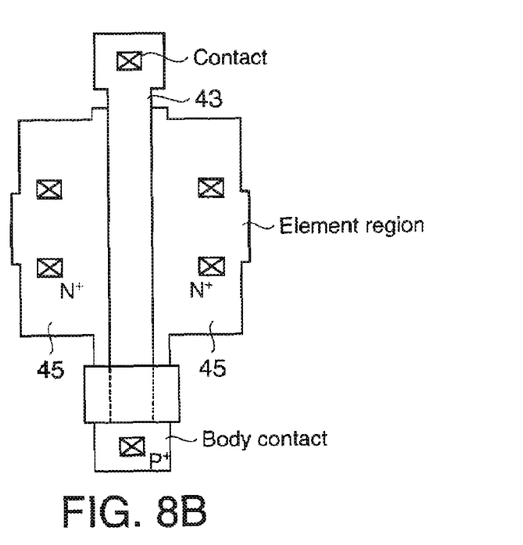

FIGS. 8A and 8B illustrate Embodiment 4. FIGS. 8A and 8B show components corresponding to those in FIGS. 5A and 5B with the same reference numerals and thus these components will not be described further. Embodiment 4 is a modification of Embodiment 3 in which, as shown in FIGS. 8A and 8B, a lower part of the element region extends in the lower direction to form a body contact. As shown in FIGS. 8A and 8B, the source/drain 45 and the body contact have opposite conductivity types. When the source/drain 45 has a N+ conductivity type for embodiment, the body contact has a P+ conductivity type.

Embodiment 5

Figure 9A:
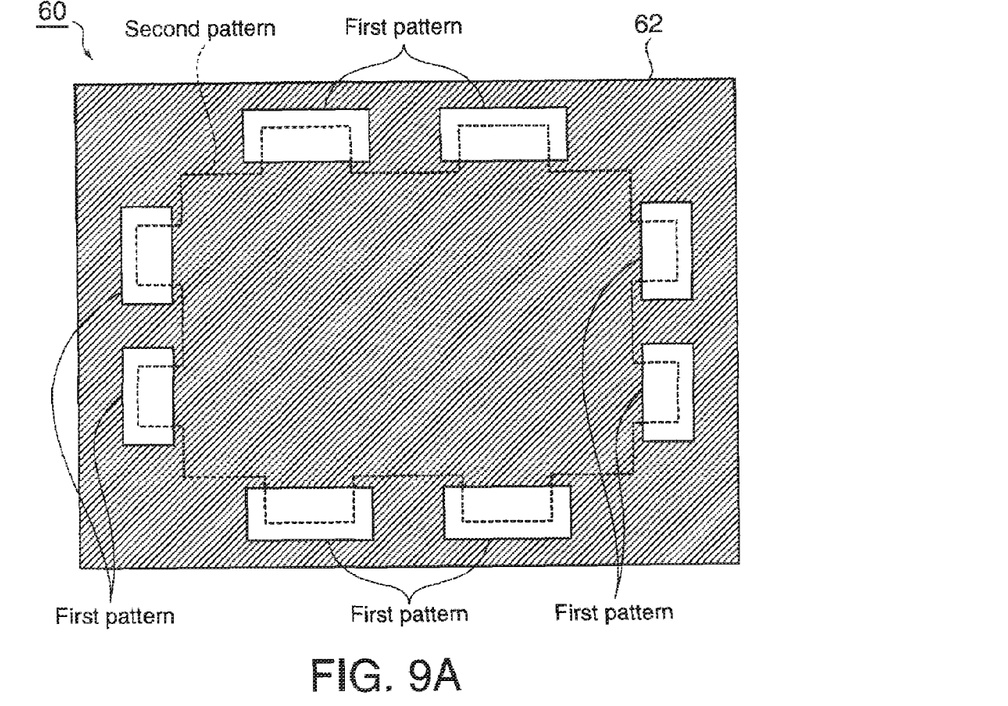
FIGS. 9A and 9B illustrate Embodiment 5.
Figure 9B:
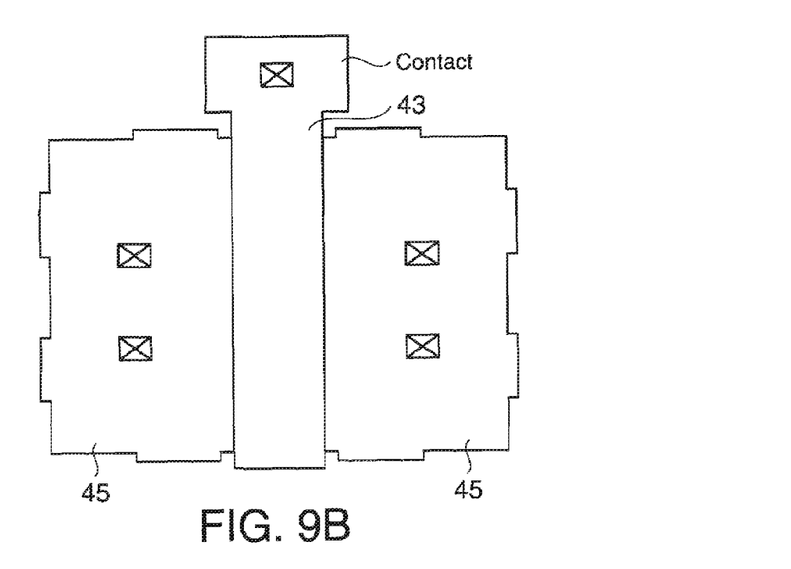

FIGS. 9A and 9B illustrate Embodiment 4. FIGS. 9A and 9B show components corresponding to those in FIGS. 5A and 5B with the same reference numerals and thus these components will not be described further. Embodiment 5 is also a modification of Embodiment 3 in which, as shown in FIGS. 9A and 9B, two or more first patterns (trenches h) are provided at every one side of the outer periphery of the element region. The structure as described above can provide, when compared with Embodiment 1 to Embodiment 4, an increased area at which the supporting body has a contact with the Si substrate (i.e., leg) and thus stress applied to the supporting body can be dispersed. Embodiment 5 is particularly preferable when the element region has a large area.

In these embodiments (Embodiment 1 to Embodiment 5), the Si substrate 1 corresponds to "semiconductor base material" of the invention and the SiGe layer 3 corresponds to "the first semiconductor layer" of the invention. In these embodiments (Embodiment 1 to Embodiment 5), the trench h (the first pattern) corresponds to "hole" of the invention and the second pattern corresponds to "predetermined region" of the invention.

The embodiments of the invention have described a case where "semiconductor base material" is made of Si, "the first semiconductor layer" is made of SiGe, and "the second semiconductor layer" is made of Si. However, the invention is not limited to these materials. For embodiment, "semiconductor base material" also may be made of, for embodiment, Si, Ge, SiGe, SiC, SiSn, PbS, GaAs, InP, GaP, GaN, or ZnSe. Alternatively, "the first semiconductor layer" also may be made of such material that has a larger etching selectivity than those of the Si substrate and the second semiconductor layer. For embodiment, "the first semiconductor layer" and "the second semiconductor layer" can be made of a combination selected from Si, Ge, SiGe, SiC, SiSn, PbS, GaAs, InP, GaP, GaN, or ZnSe for embodiment.

What is claimed is:

1. A method for manufacturing a semiconductor substrate, comprising:
    forming a first semiconductor layer on a semiconductor base material;
    forming a second semiconductor layer on the first semiconductor layer, the second semiconductor layer having an etching selectivity larger than that of the first semiconductor layer;
    forming, at the second semiconductor layer and the first semiconductor layer in the vicinity of an element region, at least three or more hole portions for exposing the semiconductor base material;
    forming, on the semiconductor base material, a supporting body for supporting the second semiconductor layer on the semiconductor base material so that the hole portions are filled and the second semiconductor layer is covered;
    etching the supporting body at regions other than predetermined regions including the hole portions and the element region to form an aperture plane in the supporting body, the aperture plane exposes a part of an end section of the first semiconductor layer;
    etching the first semiconductor layer via the aperture plane to form a hollow section between the second semiconductor layer of the element region and the semiconductor base material; and
    forming an insulation film in the hollow section,
    wherein the forming the hole portions is performed so that at least two or more the hole portions are formed in one direction of the element region and at least one or more the hole portion(s) is/are formed in the other direction crossing the one direction of the element region.

2. The method for manufacturing a semiconductor substrate according to claim 1, wherein:
    the hole portions are formed so that at least two or more the hole portions are formed in one direction of the element region and at least two or more the hole portions are formed in the other direction orthogonal to the one direction of the element region.

3. The method for manufacturing a semiconductor substrate according to claim 1, wherein:
    the element region has a concave section at a part of the outer periphery thereof; and
in the process of forming the hole portions, the hole portions are formed at positions adjacent to the concave sections of the predetermined region when seen from the top.

4. The method for manufacturing a semiconductor substrate according to claim 1, wherein:
    the predetermined region has, at a part of the outer periphery thereof, a convex section protruding from the element region; and
    in the process of forming the hole portions, the hole portions are formed at the convex section of the predetermined region.

5. The method for manufacturing a semiconductor substrate according to claim 1, wherein:
    in the process of forming, two or more the hole portions are formed at one side of an outer periphery of the element region.

6. The method for manufacturing a semiconductor substrate according to claim 1, wherein:
    the process of forming an insulation film in the hollow section is followed by planarizing an entire upper face of the semiconductor base material to remove the supporting body on the second semiconductor layer.

7. A method for manufacturing a semiconductor apparatus according to claim 6, further comprising:
    removing the supporting body on the second semiconductor layer; and subsequently forming a transistor on the second semiconductor layer.

8. The method for manufacturing a semiconductor substrate according to claim 2, wherein:
    the element region has a concave section at a part of the outer periphery thereof; and
in the process of forming the hole portions, the hole portions are formed at positions adjacent to the concave sections of the predetermined region when seen from the top.

9. The method for manufacturing a semiconductor substrate according to claim 2, wherein:
    the predetermined region has, at a part of the outer periphery thereof, a convex section protruding from the element region; and
    in the process of forming the hole portions, the hole portions are formed at the convex section of the predetermined region.

* * * * *